United States Patent [19]

Putnam

[11] 3,710,271

[45] Jan. 9, 1973

[54] FET DRIVER FOR CAPACITIVE LOADS

[75] Inventor: James A. Putman, Levittown, Pa. 19057

[73] Assignee: United Aircraft Corporation, East Hartford, Conn.

[22] Filed: Oct. 12, 1971

[21] Appl. No.: 188,041

[52] U.S. Cl. ......................330/35, 307/205, 307/304

[51] Int. Cl. ...............................................H03f 3/16

[58] Field of Search.....330/35; 307/205, 221 C, 251, 307/304

[56] References Cited

UNITED STATES PATENTS 3,506,851 4/1970 Polkinghorn et al. ............307/304 X 3,619,670 11/1971 Heimbigner......................307/251 X 3,631,267 12/1971 Heimbigner......................307/304 X

*Primary Examiner*—Roy Lake

*Assistant Examiner*—James B. Mullins

*Attorney*—Melvin Pearson Williams

[57] ABSTRACT

A field effect transistor (FET) amplifier circuit for driving capacitive loads includes two amplifier stages, each having an input FET and a related load FET, one stage driving the load, the other stage providing capacitively coupled bootstrap drive to the load FET of the load driving stage.

1 Claim, 4 Drawing Figures

INVENTOR
JAMES A. PUTNAM
BY Melvin Pearson Williams
ATTORNEY

FET DRIVER FOR CAPACITIVE LOADS

BACKGROUND OF THE INVENTION

1. Field of Invention

This invention relates to field effect transistor amplifier circuitry, and more particularly to an improved high speed switching field effect transistor amplifier for driving capacitive loads.

2. Description of the Prior Art

As is known, FETs have a pair of main current carrying electrodes commonly referred to as the source and the drain, the impedance between which is controlled by an electric field induced in a channel therebetween by means of voltage applied to an insulated gate electrode. For any given impedance established by the voltage on the gate, conduction is further controlled by the difference of potential between the source and the drain. Thus, FETs act as relatively high impedances (for solid state devices) which are variable in accordance with the gate potential.

A common form of field effect transistor circuit is an amplifier employing a pair of FETs, one acting as an input stage and the other acting as variable load for the input FET, typically utilizing a third FET as a stabilizing means for the load FET. In one such circuit known to the art, a pair of FETs are serially connected between positive and negative voltage supplies, the gate of the input FET being connected to an input signal source, the driven load being connected to a junction between the two FETs, and the gate of the load FET being capacitively coupled to the load junction between the FETs. As the input signal causes operation of the input FET to commence to alter the load voltage, this change in load voltage is coupled to the gate of the load FET, which rapidly causes a complementary change in its impedance, thereby increasing the speed at which the effect of the input signal is reflected to the load, in a regenerative or bootstrap fashion.

However, in cases where the load is highly capacitive (as is true in circuits driving further FET circuitry), the voltage of the driven load can change only slowly, and therefore the capacitively coupled bootstrap voltage to the load FET can also change only relatively slowly. This naturally offsets the ability of the bootstrap to increase switching speed.

The foregoing disadvantage becomes highly intolerable in large scale integrated FET circuits, such as those utilized in computer circuitry, due to the fact that the gate of a FET is a capacitive load. For instance, consider a shift register having many stages, each stage including a FET. Since all stages must be clocked at the same moment, this represents a huge total capacitive load to the clock driving circuit. Naturally, the switching speed of the circuitry (which directly effects the throughput speed of the associated computer circuitry) is limited by the FET switching speed which can be accomplished by the clock driving circuit.

SUMMARY OF INVENTION

The object of the present invention is to provide an improved FET amplifier circuit for driving capacitive loads.

According to the present invention, a FET amplifier for driving capacitive loads includes an output stage and a bootstrap stage, each having an input FET and a related load FET, the input FET of the output stage driving the load, and the input FET of the bootstrap stage driving the load FET of the output stage, for rapidly switching the output voltage of the amplifier. The input FET of the bootstrap stage, not being burdened by the highly capacitive load, can switch substantially more rapidly than the input FET of the output stage, and this effect is coupled to the load FET of the output stage so as to rapidly vary the load on the output stage input FET, thereby to increase the speed of its operation.

The present invention provides a simple correction to the slow switching speeds heretofore attendant FET amplifiers driving capacitive loads, and permits increased speed of operation of the attendant circuitry driven thereby.

Other objects, features and advantages of the present invention will become more apparent in the light of the following detailed description of preferred embodiments thereof, as illustrated in the accompanying drawing.

DESCRIPTION OF THE PREFERRED EMBODIMENT

For illustrative purposes herein, the description of the prior art and of the preferred embodiment is in terms of circuitry comprising P-channel enhancement mode metal oxide silicon field effect transistors (MOSFETS). The exemplary bias and control voltages, and the resulting operation are illustrated in terms of such devices. However, it should be readily understood by those skilled in the art that the principles of the prior art to which the present invention relates, and the present invention itself are equally viable in circuitry including other types of FETs.

Figure 1:
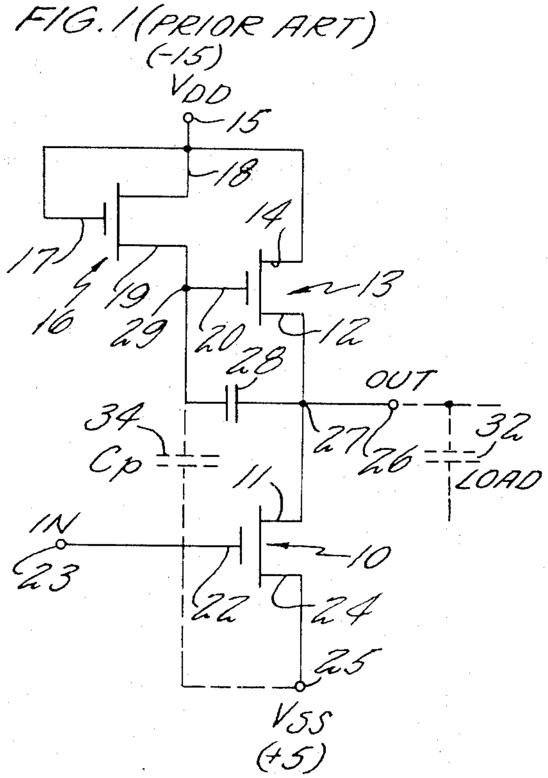
FIG. 1 (PRIOR ART)
FIG. 1 is a simplified schematic diagram of a FET amplifier known to the prior art.

In FIG. 1, an input FET 10 has its drain 11 connected to the source 12 of a load FET 13, the drain 14 of which is connected to a suitable negative voltage source 15, which in this example may comprise minus fifteen volts or other suitable negative potential. Operation of the FET 13 is stabilized by a FET 16, the gate 17 and drain 18 of which are connected to the negative supply 15, and the source 19 of which is connected to the gate 20 of the load FET 13, in the manner of a pull-down diode.

The gate 22 of the input FET 10 is connected to an input terminal 23, and the source 24 of the FET 10 is connected to a suitable voltage source 25, which in this example may comprise plus 5 volts or any other suitable positive voltage. An output terminal 26, which comprises the output of the amplifier, is connected to a junction 27 between the drain 11 of the input FET 10 and the source 12 of the load FET 13. The voltage at the junction 27 is also coupled to a coupling capacitor 28 to a junction 29 between the source 19 of the pull-down FET 16 and the gate 20 of the load FET 13, for coupling changes at the drain of the input FET 10 to the gate of the load FET 13 to govern the impedance thereof in a manner to increase the effect at the junction 27 caused by a change in gate voltage to the input FET 10. The coupling capacitor 28 thereby performs a bootstrap, or regenerative function in the circuit.

A problem with the prior art circuit of FIG. 1 exists when a capacitive load 32 is connected to the output terminal 26. Thus, in response to an input signal, any tendency for a change in voltage at the output terminal 26 can occur only very slowly due to a necessity of charging the capacitance related to the load 22. The coupling capacitor 28 thereby couples only slow changes in voltage to the gate 20 of the load FET 13, so that its impedance can change only relatively slowly in an effort to aid the voltage change at the output 26. This problem is further compounded by the presence of parasitic or spurious capacitance which is indicated by the capacitor 34. Thus, the junction 29 sees only a fraction of the changing voltage at the junction 27, dependent upon the ratio of the capacitance of the coupling capacitor 28 to the total capacitance of the capacitor 28 and the parasitic capacitor 34.

The slow switching which attends a highly capacitive load described with respect to FIG. 1 is sufficiently severe so as to hamper utilization of circuits of the type illustrated in FIG. 1 in large scale FET integration, due to the fact that signals transmitted from one FET circuit to another encounter capacitance at the gate of the driven FET. Where many FETs are driven simultaneously, large capacitive loading of the driving FET can result, and the speed of operation of the driven FETs is therefore severely curtailed.

Figures 2, 4:
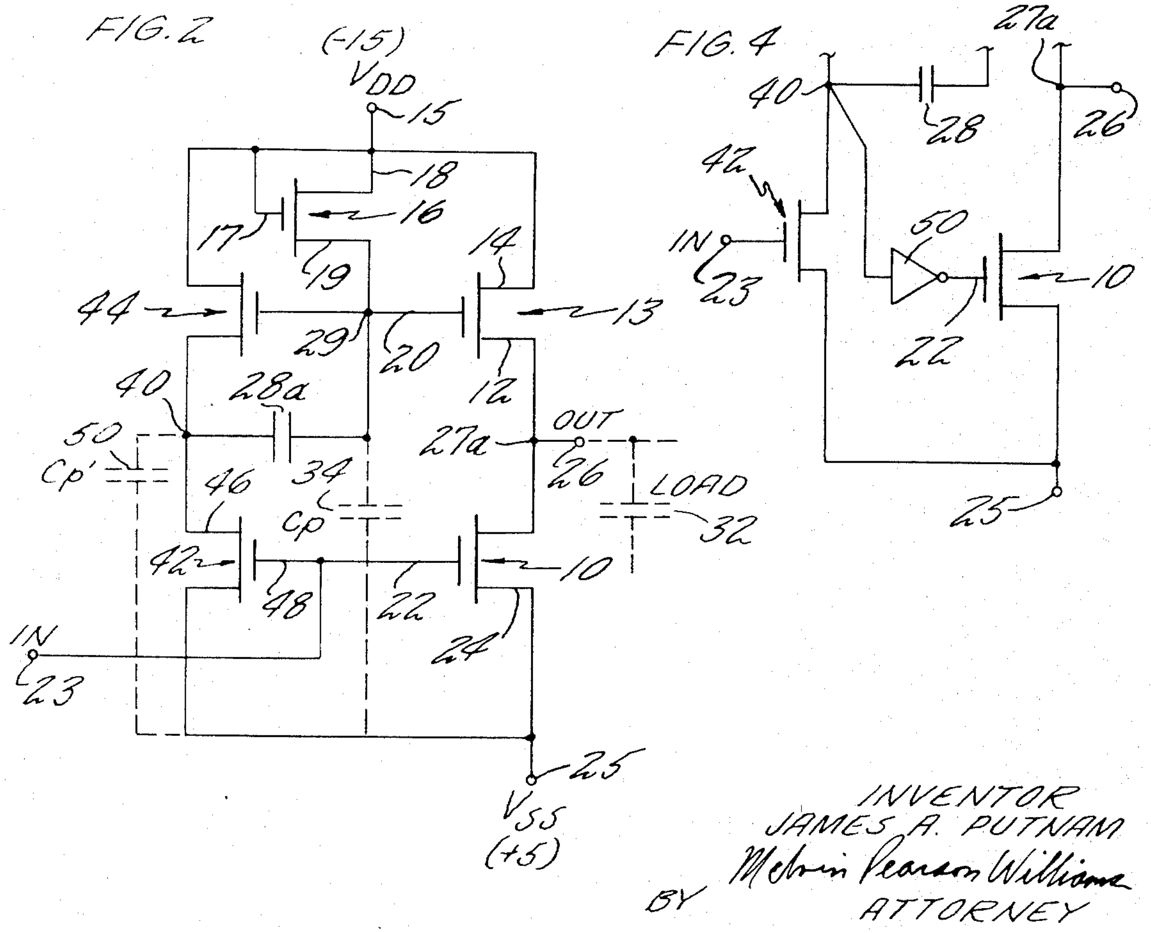
FIG. 2 is a simplified schematic diagram of a preferred embodiment of the present invention.
FIG. 4 is a simplified schematic diagram of a modification of the embodiment of FIG. 2.

The foregoing disadvantages are overcome in accordance with the present invention by providing a regenerative or bootstrap circuit which is not itself limited by the slow voltage rise time of a capacitive load, as illustrated in the preferred embodiment of FIG. 2. Therein, the circuitry of FIG. 1 is completely duplicated with the exception of the fact that the coupling capacitor *28a* is connected to a junction 40, rather than to the junction *27a*. Also, an additional pair of FETs 42, 44 are provided, each of these FETs being connected in the same fashion as the FETs 10, 13 with the exception of the fact that the junction *27a* is connected to the output terminal 26 and the junction 40 is connected to the coupling capacitor *28a*. Operation of the device in accordance with the present invention is essentially the same as that of the prior art with the exception of the fact that since the coupling capacitor *28a* is attached to the drain 46 of the input FET 42 of the bootstrap stage, it can now respond to an instantaneous change in voltage resulting from an input signal at the input terminal 23, unhampered by the time constant of the highly capacitive load 32. By connecting the bootstrap load FET 44 to the terminal 29, the bootstrap stage 42, 44 is itself regenerative, so that the voltage at the junction 29 alters very rapidly as a result of changes in voltage at the gate 48 of the input FET of the bootstrap stage. This extremely rapid change is coupled through the gate 20 of the load FET 13 of the output stage thereby to achieve the same rapid switching which would be possible with the circuit of FIG. 1 were it not for a highly capacitive load 32. Of course the parasitic capacitor 34 causes the voltage applied to the terminal 29 to be some ratio of the voltage change at the terminal 40, in accordance with the ratio of the coupling capacitance 28 to the total capacitance of the coupling capacitor 28 together with parasitic capacitor 34. There is an additional parasitic capacitance (represented in dotted fashion by the capacitor 50), but since this is relatively small, it does not tend to load the input FET 42 of the bootstrap stage to anywhere near the same degree as the capacitive load 32 affects operation of the input FET 10 of the output stage.

Figure 3:
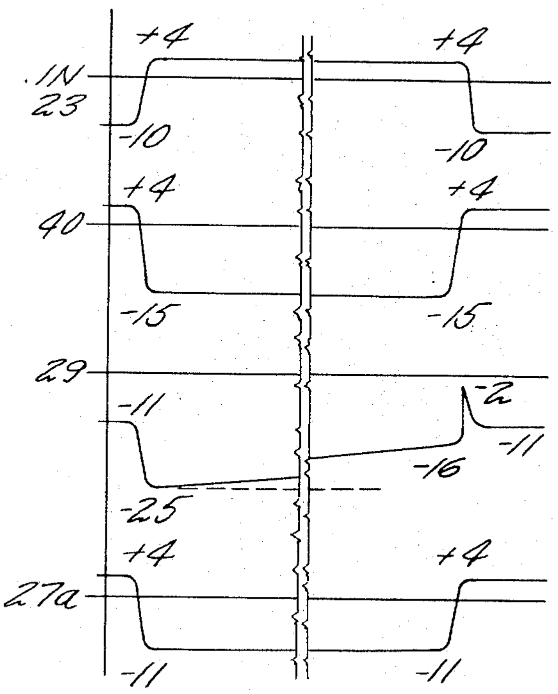
FIG. 3 is a simplified waveform diagram illustrating operation of the embodiment of FIG. 2.

Operation of the embodiment of FIG. 2 is illustrated in part in FIG. 3. Assume a quiescent condition initially with all circuit voltages in steady state. As an example, consider the input voltage on the terminal 23 to be initially minus ten volts. All of the FETs 10, 13, 16, 48, 44 are in the conducting condition. However the FETs 10, 42 are in a more highly conducting condition than are the FETs 13, 44 so the potential at the junction *27a* and 40 are at about plus 4 volts. The junction 29 is at about minus eleven volts, which is equal to the voltage of $V_{DD}$ minus the threshold voltage of the FET 16. Then consider the input voltage to switch to plus 4 volts, which cuts off the FETs 10 and 42 in an identical fashion. The voltage at the terminal 40 immediately begins to drop due to the conductive condition of the FET 44, and as it tends to drop it couples this voltage drop through the coupling capacitor *28a* to the junction 29, so that any change in voltage at the terminal 40 is simply added, on a short time basis, to the voltage of the terminal 29. This causes the gates of both FETs 13 and 44 to become more negative, decreasing the impedance of these FETs, causing them to conduct more heavily, which further causes the terminal 40 to drop more rapidly, so that an even further negative voltage change is applied to the terminal 29, in a bootstrap fashion. Therefore the terminal 29 quickly achieves a voltage which is equal to the change which can occur at the terminal 40 (very nearly minus 15 volts since the threshold voltage of the FET 44 is very low) added directly to the voltage originally at the terminal 29. Assuming a coupling capacitor *28a* to be four times as great as the parasitic capacitance 34, about four-fifths of the voltage change at the terminal 40 will be added directly to the voltage at the terminal 29. Since the terminal 40 changes from plus 4 volts to about minus 15 volts, this is roughly a voltage change of minus 19 volts, so that about minus 14 volts will be added to the voltage of the terminal 29 driving it very rapidly to approximately minus 25 volts. This causes the FETs 13, 44 to assume a highly conductive condition. With a low impedance, and a high current flow through the FET 13 (to drive the capacitive load 32), there is a significant decrease in the time it takes to raise the voltage at the output 26. After some period of time, the circuit will stabilize with the FETs 13 and 44 in a very highly conductive condition and the FETs 10 and 42 cut off. The terminal 29, however, after a period of time which is large with respect to the capacitors 34, 28, will slowly return to a quiescent condition approaching minus fifteen volts as a result of conduction of the FET 16.

Now consider the return of the input signal from plus 4 volts to minus 10 volts. The FETs 10 and 42 assume a highly conductive condition substantially immediately, which pulls the terminal 40 up toward plus five volts very rapidly. A portion of this positive increase in voltage is coupled to the capacitor 28*a* (as described previously) causing the voltage of the terminal 29 to jump rapidly positively up to some value such as minus 2 volts. This quickly dissipates back to a negative potential such as minus 11 volts as a result of operation of the FET 16. In any event, the positive swing of the terminal 29 is coupled to the gates of the FETs 13 and 14 significantly increasing their internal impedance and cutting down on the conduction therein, so the bootstrap effect operates in the opposite direction, allowing the terminals 27*a* and 40 to rapidly achieve a more positive potential such as plus 4 volts. It is to be noted that when the FET 10 is turned on, the current which drives the load 32 in a more positive direction is applied through the FET 10, and so an increase in the impedance of the load FET 13 at this time decreases current flow therethrough allowing more current to charge the capacitance of the load 32 so that its voltage can raise more rapidly than it would if the current through the FET 10 were divided between the load 32 and the FET 13. Thus, the switching action is rapid in both the on and off directions.

The FET 16 serves to ensure that the gates of the FETs 13 and 44 remain at a potential at least as negative as about minus 11 volts ($V_{DD}$ minus the threshold of the FET 16) in a fashion similar to a pull down diode. A diode may be used instead if desired, or for that matter, a resistor could be placed there instead if desired, without altering the precepts of the present invention.

In the preferred embodiment of FIG. 2, the input terminal 23 sees a capacitive load represented by the gates 22, 48 of two FETs 10, 42. In cases where the capacitance of both FETs is more than can be tolerated by the circuit driving the input terminal 23, this capacitance may be reduced by the modification of the circuit briefly illustrated in FIG. 4. Therein, the input terminal 23 drives only the input FET 42 of the bootstrap stage, the output of which is coupled through an inverting amplifier 50 to drive the gate 22 of the input FET 10 of the output stage. Inversion in the amplifier 50 is necessary since the input FET 42 of the bootstrap stage will invert the signal. In this connection, it would not serve to have the input signal 23 applied to the input FET 10 of the output stage, and try to drive the input FET 42 of the bootstrap stage therefrom, since the terminal point 27a rises relatively slowly due to the capacitive load, whereas the relatively unloaded terminal 40 may rise very rapidly as a result of operation of the FET 42. Thus, the FET 10 is connected in FIG. 4 for response to a change in signal at the input terminal 23, while providing less loading therefore. The inverting amplifier 50 may itself comprise a suitable FET circuit if desired.

Although the invention has been shown and described with respect to preferred embodiments thereof, it should be understood by those skilled in the art that the foregoing and various other changes and omissions in the form and detail thereof may be made therein without departing from the spirit and the scope of the invention.

Having thus described typical embodiments of my invention, that which I claim as new and desire to secure by Letters Patent of the United States is:

1. An amplifier circuit employing a plurality of field effect transistors (FETs), each having a pair of main current conducting electrodes and a gate electrode comprising:

first and second voltage sources;

an output stage comprising an input FET and a load FET therefor, the main current carrying electrodes of said input FET and said load FET connected between said first and second voltage sources, the output of said amplifier taken from the series connection between the main current carrying electrodes of said two FETs;

a bootstrap stage comprising an input FET and a load FET, the main current carrying electrodes of said bootstrap stage load FET and said bootstrap stage input FET being serially connected between said sources;

means for receiving an input signal, the gate electrode of each of said input FETs being connected for response to a signal at said input signal receiving means in a manner so that a signal of a first potential at said input signal receiving means tends to cause both said input FETs to conduct and a signal of a different potential at said input signal receiving means tends to cause both said inputs FETs to assume a high impedance condition;

and capacitive coupling means connecting the gate electrodes of both of said load FETs to the junction between said bootstrap stage FETs and coupling changes in voltage at said junction to the gate terminal of said load FETs, whereby alteration in the operation of the input FET of said bootstrap stage as a result of an input signal causes a commensurate alteration in the operation of said load FETs in a regenerative fashion.

* * * * *